United States Patent
Motegi et al.

(10) Patent No.: US 9,500,964 B2
(45) Date of Patent: Nov. 22, 2016

(54) LITHOGRAPHY APPARATUS, POWER SUPPLYING METHOD, AND ARTICLE MANUFACTURING METHOD

(71) Applicant: CANON KABUSHIKI KAISHA, Tokyo (JP)

(72) Inventors: Takeshi Motegi, Utsunomiya (JP); Yasuhiro Motegi, Kawachi-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 60 days.

(21) Appl. No.: 14/512,529

(22) Filed: Oct. 13, 2014

(65) Prior Publication Data
US 2015/0103328 A1 Apr. 16, 2015

(30) Foreign Application Priority Data
Oct. 16, 2013 (JP) .................. 2013-215364

(51) Int. Cl.
| | |
|---|---|
| G03B 27/42 | (2006.01) |
| G03B 27/58 | (2006.01) |
| G03B 27/62 | (2006.01) |
| G03F 7/20 | (2006.01) |
| H02P 25/06 | (2016.01) |
| H02P 5/46 | (2006.01) |

(52) U.S. Cl.
CPC ....... *G03F 7/70725* (2013.01); *G03F 7/70758* (2013.01); *H02P 5/46* (2013.01); *H02P 25/06* (2013.01)

(58) Field of Classification Search
CPC ........... G03F 7/70725; G03F 7/70758; G03F 7/70716; G03F 7/70691; G03F 7/70775; H02P 25/06; H02P 5/46

USPC ......... 355/46, 53, 72–77; 250/442.11, 492.1, 250/492.2, 492.22, 493.1, 548; 310/12.01, 310/12.04–12.06, 12.13, 112, 177; 318/135, 687, 695, 696, 662, 794, 795, 318/817

See application file for complete search history.

(56) References Cited

U.S. PATENT DOCUMENTS

| | | | | |
|---|---|---|---|---|
| 4,635,282 | A | * 1/1987 | Okada | B82Y 10/00 250/281 |
| 2008/0106155 | A1 | * 5/2008 | Yamada | B60L 13/03 310/12.19 |
| 2014/0253897 | A1 | * 9/2014 | Liu | H01L 21/682 355/71 |

FOREIGN PATENT DOCUMENTS

JP  2002369579 A  12/2002

\* cited by examiner

*Primary Examiner* — Christina Riddle
(74) *Attorney, Agent, or Firm* — Rossi, Kimms & McDowell LLP

(57) ABSTRACT

A lithography apparatus has a plurality of driving units each of which drives in synchronization within a specific period, a power source for supplying power required for driving to each driving unit, a plurality of capacitors capable of charging power from the power source, a plurality of switching units for switching whether or not power is supplied from the power source to the driving units and capacitors, and a controller configured to stop supplying the power to the driving units and the capacitors and to drive the driving unit with the power charged in the capacitor, in at least a part of a period of driving in synchronization concerning at least one of the plurality of the driving units, or in at least a part of a period of driving in asynchronization concerning another driving unit different from at least one of the driving unit.

8 Claims, 9 Drawing Sheets

LITHOGRAPHY APPARATUS, POWER SUPPLYING METHOD, AND ARTICLE MANUFACTURING METHOD

BACKGROUND OF THE INVENTION

Field of the Invention

The present invention relates to a lithography apparatus, a power supplying method, and an article manufacturing method.

Description of the Related Art

A lithography apparatus transfers a desired pattern onto, for example, a substrate in lithography steps included in manufacturing steps for articles such as a semiconductor device, a liquid crystal display device and the like. An exposure apparatus, which is an example of the lithography apparatus, transfers (exposes) a pattern formed in advance on an original (a reticle, a mask or the like) onto the substrate (a wafer, a glass plate or the like), on which photosensitive material has been applied, via a projection optical system. A wafer stage, a reticle stage, a masking blade and their active counters are driven in synchronization to each other during a scan exposure with a step-and-scan type semiconductor exposure apparatus. Similarly, a plate stage and a mask stage are driven in synchronization to each other during a scan exposure with a step-and-scan type liquid crystal exposure apparatus.

In the exposure apparatuses described above, an improvement of throughput is required from the viewpoint of productivity. As an important element for high throughput, there is a high speed driving of a stage device which hold the substrate, the original or the like and are movable as described above. In general, a rigid material is used for a structure body of the stage device in order to prevent deformation during a high-speed drive, so that stage weight tends to increase. Particularly in the liquid crystal exposure apparatus, a stage size also increases according to the requirement for increasing a size of the glass plate, so that stage weight tends to increase. Meanwhile, a highly-efficient linear motor is generally used as an actuator of the stage device. Moreover, the stage device having a high-acceleration and high-weight often comprises the linear motors positioned in parallel in order to obtain high thrust.

However, in a case where the stage device is driven at high speed employing the linear motor, a driver is required to supply a large amount of power to the linear motor, especially during acceleration upon the deceleration. Firstly, the driver needs to obtain power to be consumed from any of power sources in an acceleration period of the stage device. Meanwhile, little power is consumed in a constant speed period since little thrust is required. Then, a regenerative electric power returns to the power source since a counter electromotive force of the linear motor is generated in a deceleration period. In the above structure of the device, a peak power is generated upon the acceleration and the peak power returns upon deceleration. Accordingly, the peak power in the lithography apparatus such as the exposure apparatus increases and the power consumption increases according to high throughput, so that enlargement of a size of the power source and extension of equipment may occur. For example, in order to suppress an increase of voltage in the power source caused by returning the regenerative electric power upon deceleration, employing a high capacity capacitor as the power source for the driver to avoid increasing the size of the power source can be considered. An exposure apparatus which employs a high capacity capacitor for suppressing the increase of the size of the power source and compensates power source amount upon the acceleration requiring a considerable amount of power is disclosed in Japanese Patent Laid-Open No. 2002-369579.

However, particularly in a step-and-scan type exposure apparatus, timings of acceleration requiring a considerable amount of power overlap since the substrate stage, the original stage, or other driving units are driven in synchronization. Accordingly, the peak power of the whole device is likely to increase considerably compared to the other types of the exposure apparatuses, and further improvement is desired. In contrast, while reconsidering methods of driving in synchronization may be reviewed, a decrease of throughput may be caused depending on exposure conditions.

SUMMARY OF THE INVENTION

The present invention provides, for example, a lithography apparatus advantageous in reduction of the peak power of the apparatus that has a plurality of driving units for driving in synchronization by supplying power from the corresponding power sources.

According to an aspect of the present invention, a lithography apparatus that includes a plurality of driving units, each of which drives in synchronization within a predetermined period is provided that comprises a power source for supplying power required for driving to each of the plurality of the driving units; a plurality of capacitors capable of respectively charging the power from the power source; a plurality of switching units respectively switching whether or not the power is supplied from the power source to the driving units and the capacitors; and a controller configured to control switching of a plurality of the switching units, and wherein the controller is configured to stop supplying the power to the respectively corresponding driving units and capacitors, and to drive the driving unit with the power charged in the capacitor in at least a part of period of driving in synchronization concerning at least one of the plurality of driving units, or in at least a part of period of driving in asynchronization concerning another driving units different from the at least one of the driving units.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

First Embodiment

Figure 1:
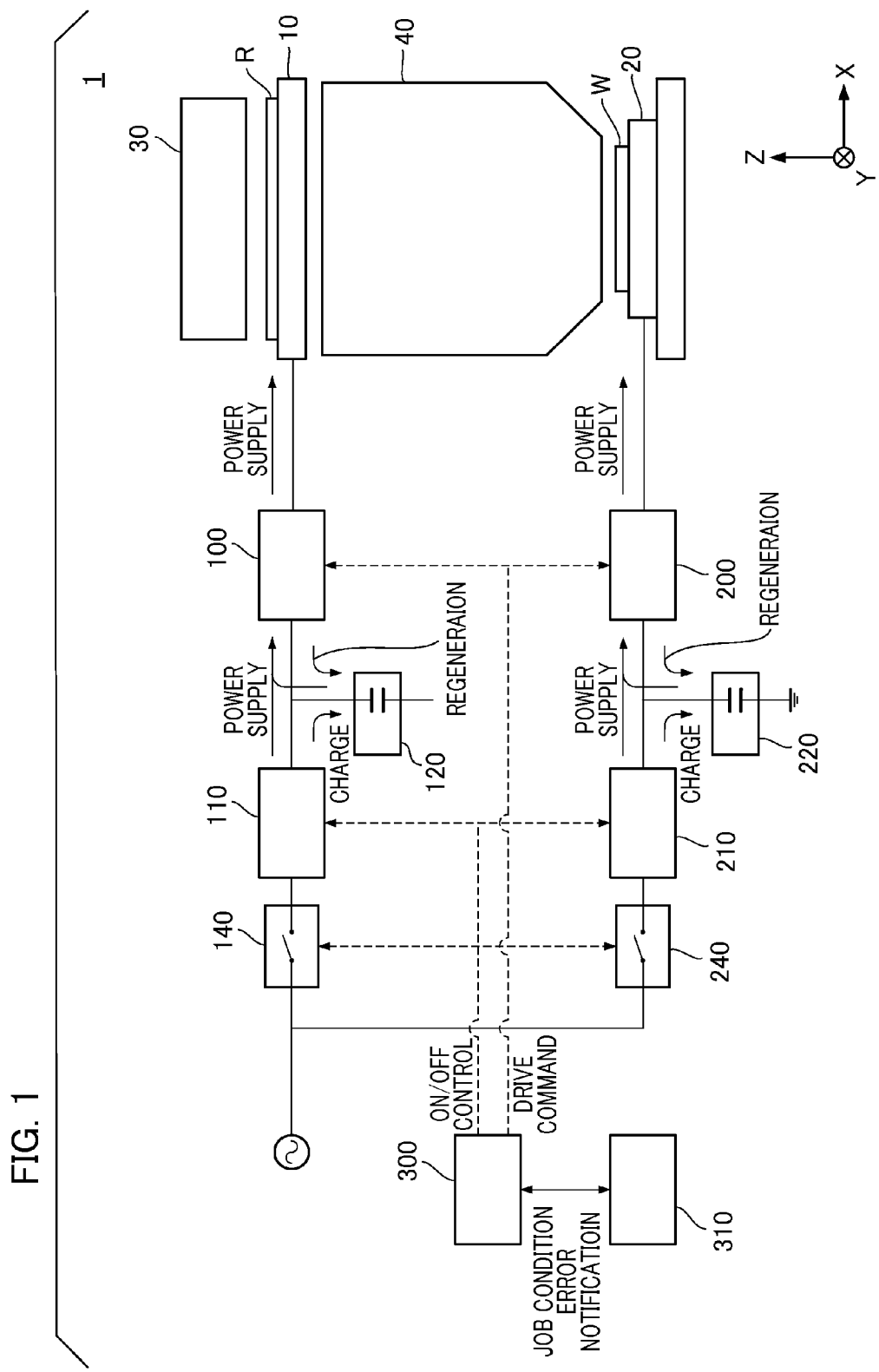
FIG. 1 illustrates a configuration of an exposure apparatus according to a first embodiment of the present invention.

Firstly, a description will be given of a lithography apparatus according to a first embodiment of the present invention. Hereinafter, an exposure apparatus will be described as one example of the lithography apparatuses according to the present embodiment. FIG. 1 is a schematic diagram illustrating a configuration of an exposure apparatus 1 according to the present embodiment. The exposure apparatus 1 is a projection type exposure apparatus which is used in a manufacturing process of a semiconductor device and transfers a pattern formed on a reticle R to a wafer W (onto a substrate) by a step-and-scan method. The exposure apparatus 1 comprises an illumination system 30, a reticle stage 10 for holding the reticle R, a projection optical system 40, a wafer stage 20 for holding the wafer W, and a controller 300. In FIG. 1, the Z-axis is positioned parallel to an optical axis of the projection optical system 40 (a vertical direction in the present embodiment), the X-axis is positioned in a scanning direction of the reticle R and the wafer W upon exposure in a plane perpendicular to the Z-axis, and the Y-axis is positioned in a non-scanning direction orthogonal to the X-axis.

The illumination system 30 adjusts light emitted from a light source (not illustrated) and illuminates the reticle R. The reticle R is an original made of, for example, silica glass, and formed with a pattern (for example, a circuit pattern) to be transferred onto the wafer W. The reticle stage (original holder) 10 holds the reticle R and is movable in each axis direction, for example, of the XY direction. The projection optical system 40 projects an image of the pattern on the reticle R illuminated with light from the illumination system 30 onto the wafer W at predetermined magnification (for example, ½ to ⅕). The wafer W is a substrate that is made, for example, of single crystal silicon. A resist (photoresist) is applied to the surface thereof. The wafer stage (substrate holder) 20 holds the wafer W by vacuum suction via a chuck (not illustrated) and is movable in each axis direction, for example, of XYZ direction. The reticle stage 10 and the wafer stage 20 may employ linear motors as driving units respectively. The linear motor levitates a moving body by air pressure, magnetic force or the like and moves the moving body by thrust generated by Lorentz force. It is noted that each position of the reticle stage 10 and the wafer stage 20 is continuously detected by using laser interferometers (not illustrated) during the scan movement thereof. The controller 300 sends driving commands to each of drivers 100 and 200 as described below, which corresponds to the reticle stage 10 and the wafer stage 20, based on position information from each of the laser interferometers. Thus, the controller 300 enables correctly synchronizing the scanning start position of the reticle stage 10 and the wafer stage 20, and enables controlling the scanning speed in a constant-speed scanning section with high accuracy.

The controller 300 may execute operation controls and arithmetic processing of each component of the exposure apparatus 1. The controller 300 is configured, for example, by a computer connected to each component of the exposure apparatus 1 via a line and may execute controls of each component according to a sequence. The exposure apparatus 1 comprises a system console 310 that is an interface operated by an operator and is connected to the controller 300 via the line. In particular, the driving commands to the reticle stage 10 and the wafer stage 20 from the controller 300 are determined by job conditions that are along an exposure process and are input into the system console 310. The control unit 300 or the system console 310 may have a configuration of integration with another portion of the exposure apparatus 1 (in a common housing), or may be configured as a separate component to the other portions of the exposure apparatus 1 (in a separate housing).

In addition, the exposure apparatus 1 comprises a first driver 100, a first power source 110, and a first switch 140 that serve as a driving system for the reticle stage 10. In a similar manner, the exposure apparatus 1 comprises a second driver 200, a second power source 210, and a second switch 240 that serve as a driving system for the wafer stage 20. Especially during exposure, while the first driver 100 supplies the power (electric power supply) to the reticle stage 10, the second driver 200 supplies the power to the wafer stage 20, so that the reticle stage 10 and the wafer stage 20 perform a scan movement in synchronization to each other. Here, the first power source 110 supplies the power to the first driver 100, and the second power source 210 supplies the power to the second driver 200. Further, the first switch 140 and the second switch 240, which serve as switching units, respectively switch ON/OFF of each of power sources 110 and 120 and ON/OFF of power supply to each power source, based on the control of the controller 300.

In recent years, acceleration speed and scanning speed of the reticle stage and the wafer stage tend to be increased from the viewpoint of productivity. Since the generating thrust of the linear motor is proportional to driving current, each driver needs to supply a large amount of power to the linear motor especially upon the acceleration upon the deceleration. In the acceleration of each stage especially, the power to be consumed by each driver needs to be covered by the power of the power source of each driver. In contrast, while little power is consumed since little thrust is required in the constant speed period, regenerative electric power returns to the power source because the reverse voltage, which is proportional to the scanning speed of each stage and the resistance of coils, is generated in the deceleration period. With reference to device power (the total power consumption of the exposure apparatus 1), peak power generates upon the acceleration of each stage and peak power returns upon deceleration. Thus, the exposure apparatus 1 of the present embodiment comprises a high capacity first capacitor 120 which is capable of charging regenerative electric power upon deceleration of the reticle stage 10, in addition to the charge from the first power source 110, between the first driver 100 and the first power source 110. Similarly, the exposure apparatus 1 comprises a high capacity second capacitor 220 which is capable of charging regenerative electric power upon deceleration of the wafer stage 20, in addition to the charge from the second power source 210, between the second driver 200 and the second power source 210. Thereby, the exposure apparatus 1 covers power source capacity upon the acceleration of each stage requiring considerable electric power, with use of each of the capacitors 120 and 220, as described below.

Figure 2:
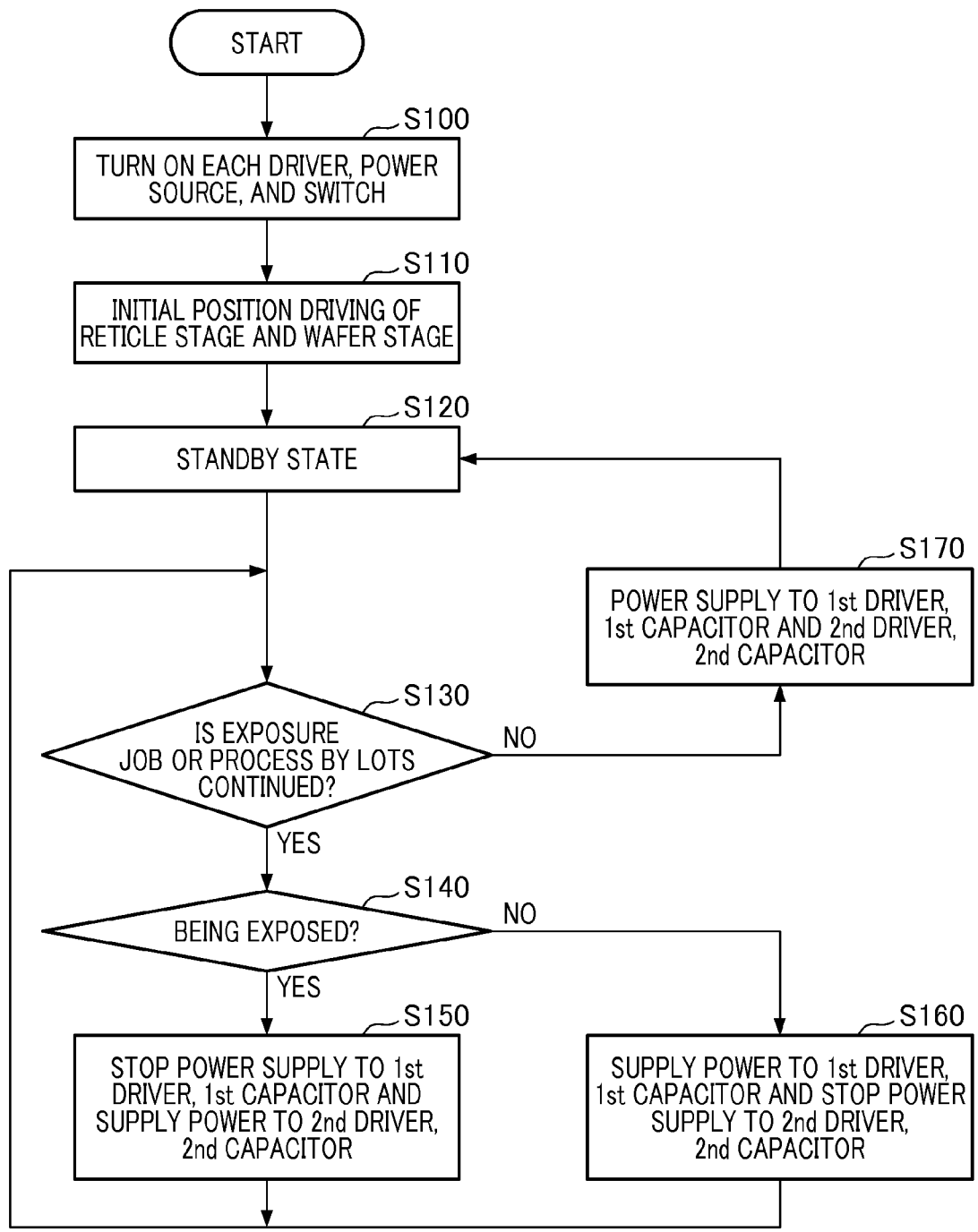
FIG. 2 is a flowchart illustrating a flow of controlling the driving system in the first embodiment.

Next, a description will be given of a driving system unit in the exposure apparatus 1, here in particular, driving of each stage, and a power supply (power supplying method) of the driving system as one example. FIG. 2 is a flowchart illustrating the flow of driving control of the stage driving system in accordance with the flow of the whole process in the present embodiment. It is noted that exposure process to the wafer W by use of the exposure apparatus 1 handles 25 sheets of the wafers W as one lot in general, and the exposure process is continuously performed according to an exposure job predetermined in a sequence (including driving condition of each driving unit). Firstly, operation of the exposure apparatus 1 is started by the operation of a system console 310 (turning on of the power source of the exposure apparatus 1) by an operator, and the controller 300 turns on each of the drives 100 and 200, each of the power sources 110 and 210, and each of the switches 140 and 240 (step S100). Secondly, the controller 300 carries out the initial position driving of the reticle stage 10 and wafer stage 20 (step S110). Then the exposure apparatus 1 is set to a standby state by the controller 300 (step S120).

Subsequently, exposure to the wafer W (exposure job or process by lots) is started by the controller 300 based on the operation (job start command) of the system console 310 by the operator. Upon start of the exposure, the controller 300 judges whether the exposure job or the process by los is being continued or not (step S130). Here, in the case where the controller 300 judges that exposure job or the process by lots is being continued (Yes), the following operation is carried out. Firstly, the wafers W set in a wafer carrier are taken out one by one by a wafer transfer system (not illustrated), alignment an alignment is performed, and the wafer W is transferred onto the chuck of the wafer stage 20. Secondly, the controller 300 has the chuck hold the wafer W and measure the position of a plurality of alignment marks on the wafer W formed in advance upon a process of a previous time by use of a microscope (alignment measurement system; not illustrated) in sequence. Thirdly, the controller 300 obtains positional displacements, rotational displacements and change of magnification of the pattern and properly and the like corrects them prior to the actual exposure.

Subsequently, the controller 300 moves the wafer stage 20 and irradiates exposure light onto an initial exposure position in a plurality of shots (pattern forming area) on the wafer W to continuously perform step movement of each of stages 10 and 20 and the irradiation of the exposure light (step S140). At this time, the controller 300 continuously judges whether the exposure is being actually performed, i.e. whether the step movement and the irradiation of the exposure light are actually performed or not in step S140. Here, during the specific period when the controller 300 judges that exposure is being actually performed (Yes), the controller 300 turns off the first power source 110 or the first switch 140 to stop power supply to the first driver 100 and the first capacitor 120 (step S150: a first step). The reticle stage 10 is driven with charge stored at the first capacitor 120 and with regenerative electric power generated upon deceleration of the reticle stage 10. In contrast, during the specific period when the controller 300 judges that exposure is not being performed (No) in step S140, the second power source 210 or the second switch 240 is turned off to stop power supply to the second capacitor 220 (step S160: a second step). It is noted that the period when exposure is not being performed means, for example, the timing of exchanging the wafer W. At this time, the wafer stage 20 is driven with a charge stored at the second capacitor 220 and with regenerative electric power generated upon deceleration of the wafer stage 20. Simultaneously, the controller 300 turns on the first power source 110 or the first switch 140 to perform charging to the first capacitor 120, which is electrically consumed during the period of step movement of the reticle stage 10 and the irradiation of the exposure light. The controller 300 repeats the operations until it judges that the exposure job or process by lots is not to be continued (No) in the step S130.

The controller 300 turns on each of the power sources 110 and 120, and each of the switches 140 and 240 in a case where the controller 300 judges that the exposure job or the process by lots are not continued (No) (step S170). Accordingly, the exposure apparatus 1 is set to the standby state until the next job command or the subsequent lot (a series of process is completed at a time).

Figure 3:
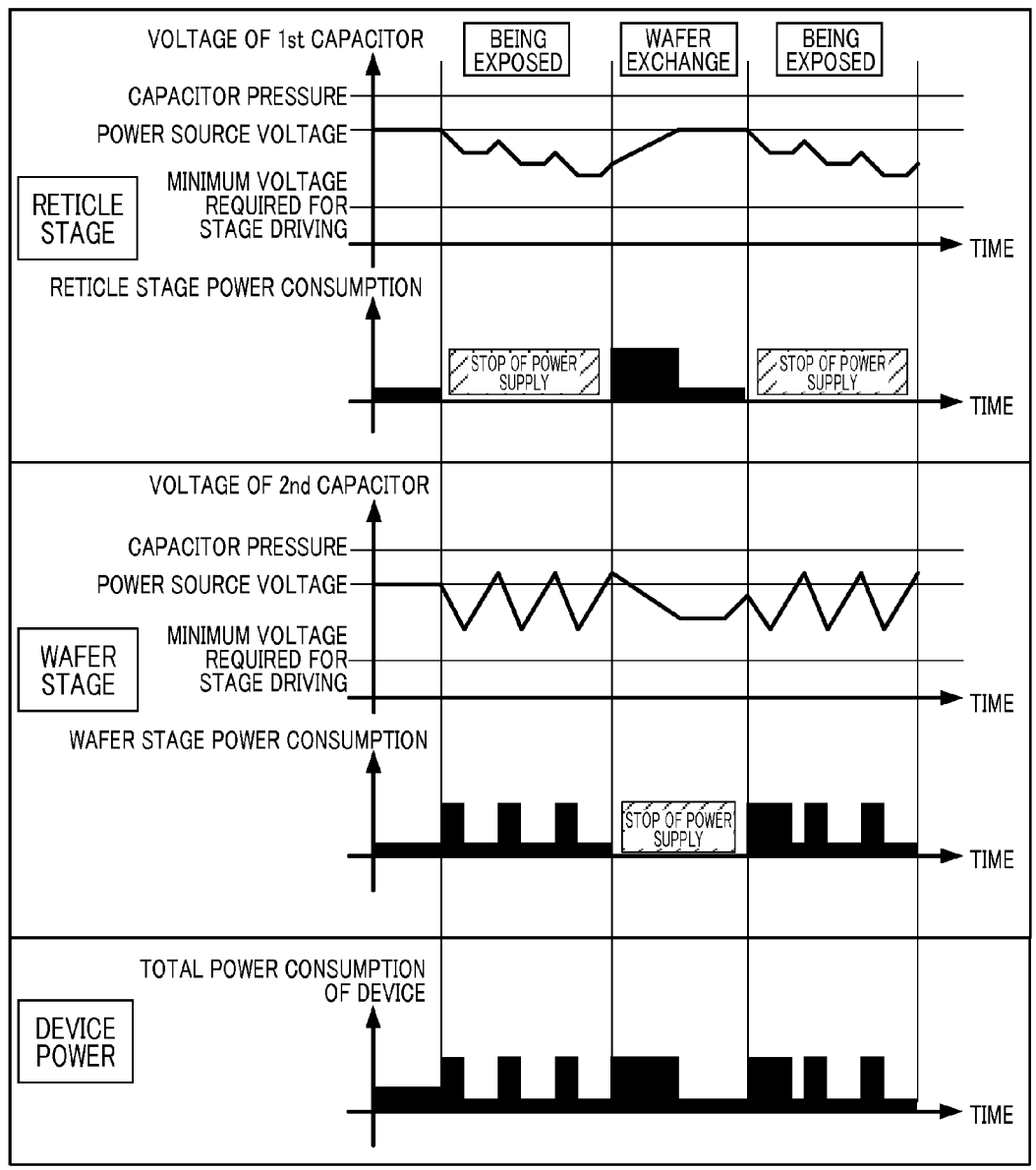
FIG. 3 is a graph illustrating a change of a capacitor voltage in the first embodiment.

FIG. 3 is a graph illustrating changes of each voltage and power consumption of the first capacitor 120 and the second capacitor 220 in the first embodiment. Firstly, during period when step movement of each of the stages 10 and 20 and the irradiation of the exposure light are actually performed in step S150 in FIG. 2 (described as "being exposed" in FIG. 3), power supply to the first power source 110 and the first capacitor 120 is stopped. Therefore, consumption of the device electric power (equipment electric power) by driving of the reticle stage 10 does not occur. Moreover, upon the acceleration of the reticle stage 10, necessary power consumption is covered by charge stored at the first capacitor 120, so that a capacitor voltage decreases. In contrast, upon deceleration of the reticle stage 10, regenerative electric power due to deceleration is charged to the first capacitor 120 so that the capacitor voltage increases. The voltage of the first capacitor 120 gradually decreases while repeating the acceleration and the deceleration. Then, power consumption necessary for driving the wafer stage 20 during this period is covered with the device power.

In contrast, during a period when step movement of each of the stages 10 and 20 and the irradiation of the exposure light are not actually performed in step S160 in FIG. 2 (described as "wafer exchange" in FIG. 3), power supply to the second power source 210 and the second capacitor 220 are stopped. Accordingly, the consumption of device electric power by driving of the wafer stage 20 does not occur. Simultaneously, according to turning on of the first power source 110 and the first switch 140 for the reticle stage 10, power consumption for the period when the step movement of the reticle stage 10 and the irradiation of the exposure light is performed, is charged to the first capacitor 120 from the device power.

Figure 9:
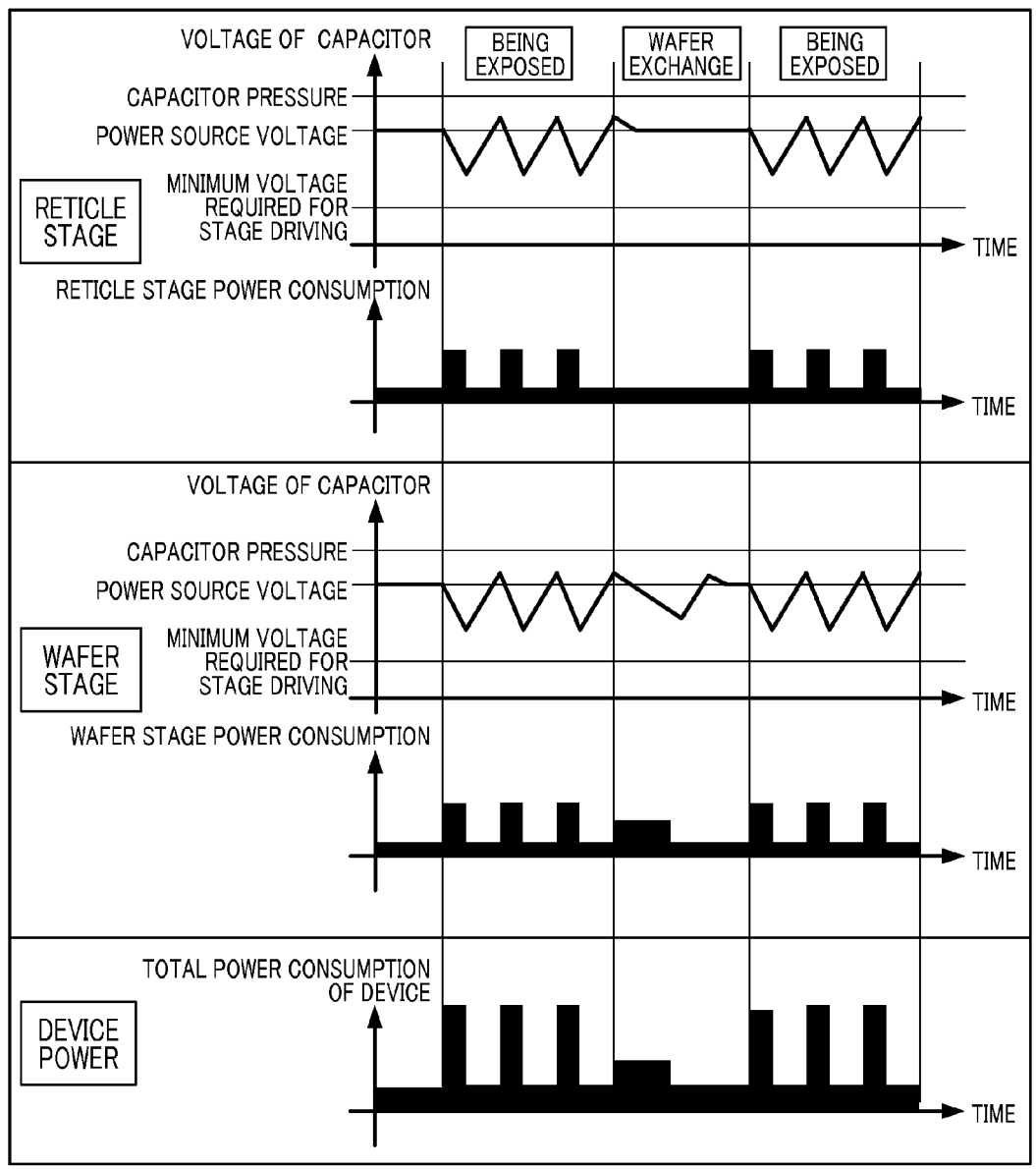
FIG. 9 is a graph illustrating changes of a capacitor voltage and the like in a conventional apparatus.

FIG. 9 is a graph illustrating changes of each voltage and each power consumption of capacitors for driving of each stage in a case where the operation and the power supply of the stage driving system in the present embodiment are not performed, as a conventional example for comparison. If an system is not under the present embodiment, as shown in FIG. 9, peak powers of the reticle stage and the wafer stage are overlapped, so that it is shown that the peak of the device electric power increases. Thus, the exposure apparatus 1 is capable of reducing peak power thereof by properly adjusting the timing of the power supply from the device electric power with reference to the stage driving system, as described above. Reducing the peak power is preferable since it allows preventing an increase in the size of each of the power sources 110 and 210.

Figure 4:
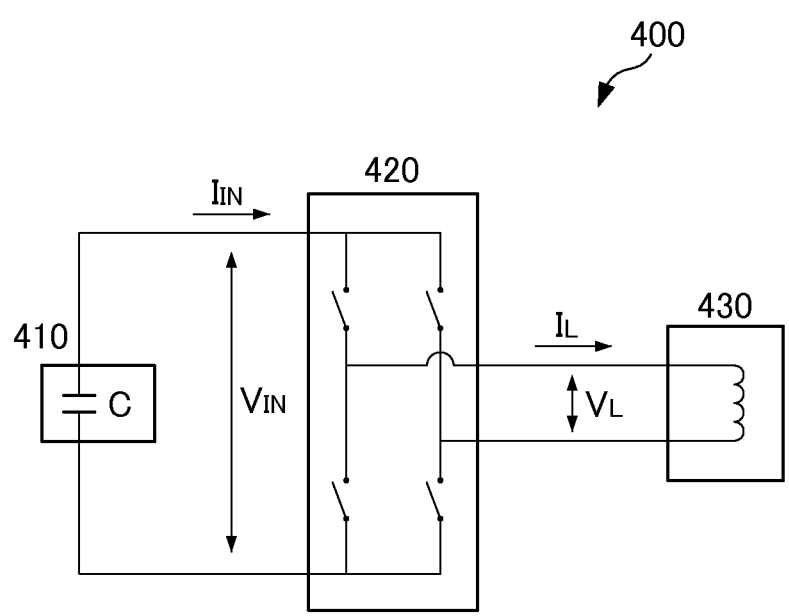
FIG. 4 illustrates a circuit including the capacitor which can be applied to the first embodiment.

Next, a description will be given of capacitor capacity which can be set to the first capacitor 120 and the second capacitor 220. FIG. 4 is a schematic diagram illustrating a circuit 400, which includes a capacitor 410 that is applicable to the first capacitor 120 and the second capacitor 220. In the circuit 400, a load current of load of linear motor load 430 is supplied from a driver 420, and the driver 420 is supplied power from the capacitor 410. Here, the supply voltage and the supply current to the driver 420 from the capacitor 410 are respectively denoted by $V_{IN}$ and $I_{IN}$, the load current to the linear motor load 430 from the driver 420 is denoted by $I_L$, and a motor voltage generated at the linear motor load 430 is denoted by $V_L$.

Figure 5:
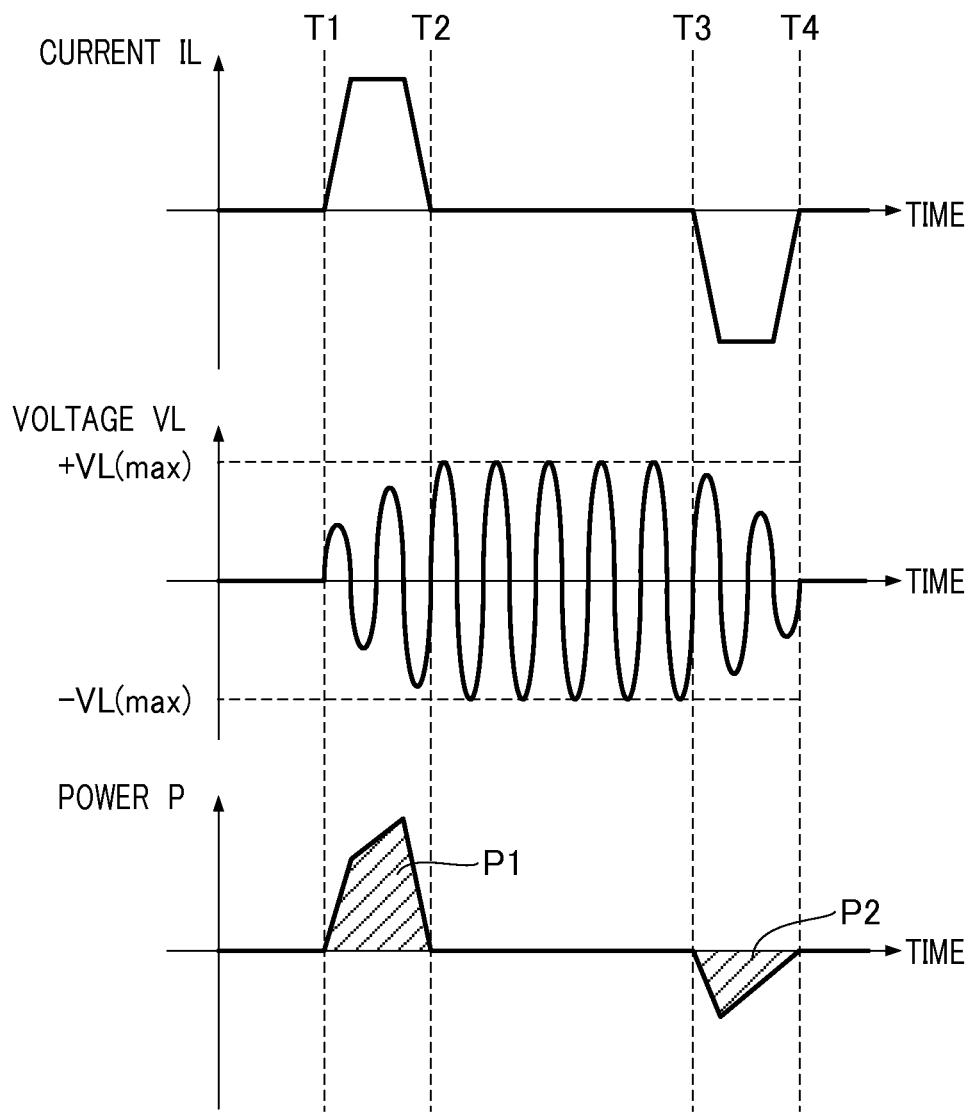
FIG. 5 illustrates changes of a current, a voltage, and power of the exposure apparatus.

FIG. 5 is a graph illustrating changes of a current, a voltage, and power of the linear motor load 430 in the lithography apparatus (for example, the exposure apparatus 1). The scan stage driven by receiving the linear motor load 430 performs scan movement after reaching a maximum speed through acceleration between acceleration start time T1(s) and acceleration end time T2(s) to stop through deceleration between deceleration start time T3(s) upon the deceleration end time T4(s). The driver 420 requires a large amount of current in order to obtain a high thrust for the scan stage during a short time with reference to the acceleration and the deceleration of the driving. While little current is consumed due to uniform motion upon the scan movement (scan exposure) of the scan stage, reverse voltage generated upon driving of the linear motor at maximum speed becomes max, so that it is necessary to cover this. Specifically, in the case where the high side switching ON duty of the driver 420 is denoted by D, the relation between the motor maximum voltage $V_{L(max)}$ and power source voltage at the high side (voltage between initial capacitors) $V_{IN}$ must satisfy the following formula (1):

[Formula 1]

$$V_{IN} \times D > V_{L(Max)} \quad (1)$$

In contrast, the power consumption P1 of the driver upon the acceleration of the scan stage is represented by the sum of the motor power and driver loss in a case where the driver efficiency is denoted by $\eta$, as in the following formula (2):

[Formula 2]

$$P1 = \int_{T1}^{T2}(I_L \times V_L)dt + (1-\eta)\int_{T1}^{T2}|I_L \times V_L|dt \quad (2)$$

In a case where the capacitor 410 is assumed to entirely cover the electric power, voltage descent $\Delta V_{IN1}$ of power source voltage $V_{IN}$ is represented by the following formula (3) by use of $P=1/2 \times CV^2$, wherein the capacitor capacity is expressed as C:

[Formula 3]

$$\Delta V_{IN1} = \sqrt{\frac{2P1}{C}} \quad (3)$$

Then, the capacitor capacity upon the acceleration required for a one time scan movement is represented by the following formula (4) according to the formulas (1) and (3):

[Formula 4]

$$C > \frac{2P1}{\left(V_{IN} - \frac{V_{L(Max)}}{D}\right)^2} \quad (4)$$

While the driver 420 supplies power to the linear motor upon the acceleration of the scan stage, counter electromotive force is generated at the linear motor upon deceleration thereof, so that the regenerative electric power returns to the driver 420. Power returned to the driver 420 returns to the capacitor 410 via a switching element. Power consumption P2 at this time is represented by the following formula (5):

[Formula 5]

$$P2 = \int_{t3}^{t4}(I_L \times V_L)dt + (1-\eta)\int_{t3}^{t4}|I_L \times V_L|dt \quad (5)$$

Here, the result of the formal (5) is calculated as minus since the regenerative electric power is dominant upon the deceleration of the scan stage. In this case, the voltage increase $\Delta V_{IN2}$ is represented by the following formula (6) by using $P=1/2 \times CV^2$:

[Formula 6]

$$\Delta V_{in2} = \sqrt{\frac{2|P2|}{C}} \quad (6)$$

Then, the capacitor voltage $\Delta V_{IN}$ for a one time scan movement is allowed to approximate the following formula (7) according to the formulas (3) and (6):

[Formula 7]

$$\Delta V_{in} = \Delta V_{in1} - \Delta V_{in2} \quad (7)$$

Accordingly, the capacitor capacity C required upon n-time scan movement after turning off of the power supply to the driver 420 is represented by the following formula (8) according to the following formulas (4) and (7):

[Formula 8]

$$C > \frac{2P1}{\left(V_{in} - n\Delta V_{in} - \frac{V_{L(Max)}}{D}\right)^2} \quad (8)$$

It is noted that since servo motor is operated even during scan movement (i.e. at the timing of constant speed) of the scan stage, the current that flows to the linear motor is not zero and the power consumption to the driver 420 is generated. While the power consumption is considerably low compared to of the period during the acceleration and the deceleration and the amount thereof does not influence the condition of the formula (8), it is desirable to set (configure) capacitor capacity C with some margin, considering the conditions.

In particular, in the case where the lithography apparatus according to the present embodiment is a large sized exposure apparatus such as a semiconductor exposure apparatus and a liquid crystal exposure apparatus, the capacitor capacity C requires approximately tens of F (farad). In this situation, it is desirable to use a capacitor having a high energy density such as electric double layers as the capacitor. On the other hand, if it is the case where the lithography apparatus does not require a high capacity capacitor, for example, an aluminum electrolytic capacitor that has a low internal resistance and has excellent charging and discharging characteristics may be employed. While a recent electric double layer capacitor has low internal resistance, approximately $1\Omega$ which tends to be low in loss, the efficiency of a high capacity switching power source is approximately 0.7 to 0.8, causing a loss of 20 to 30%. Accordingly, saving energy for the whole lithography apparatus can be carried out by stopping switching of the power sources 110 and 210 at the timing of requiring the most power and supplying the power by use of each of the capacitors 120 and 220 only, as described in the present embodiment.

As described above, in the present embodiment, it is possible to provide a lithography apparatus which is advantageous in reducing the peak power of the device, in the case where the device has a plurality of driving units, in which power is supplied from the respective device power sources, and driven in synchronization.

Second Embodiment

Figure 6:
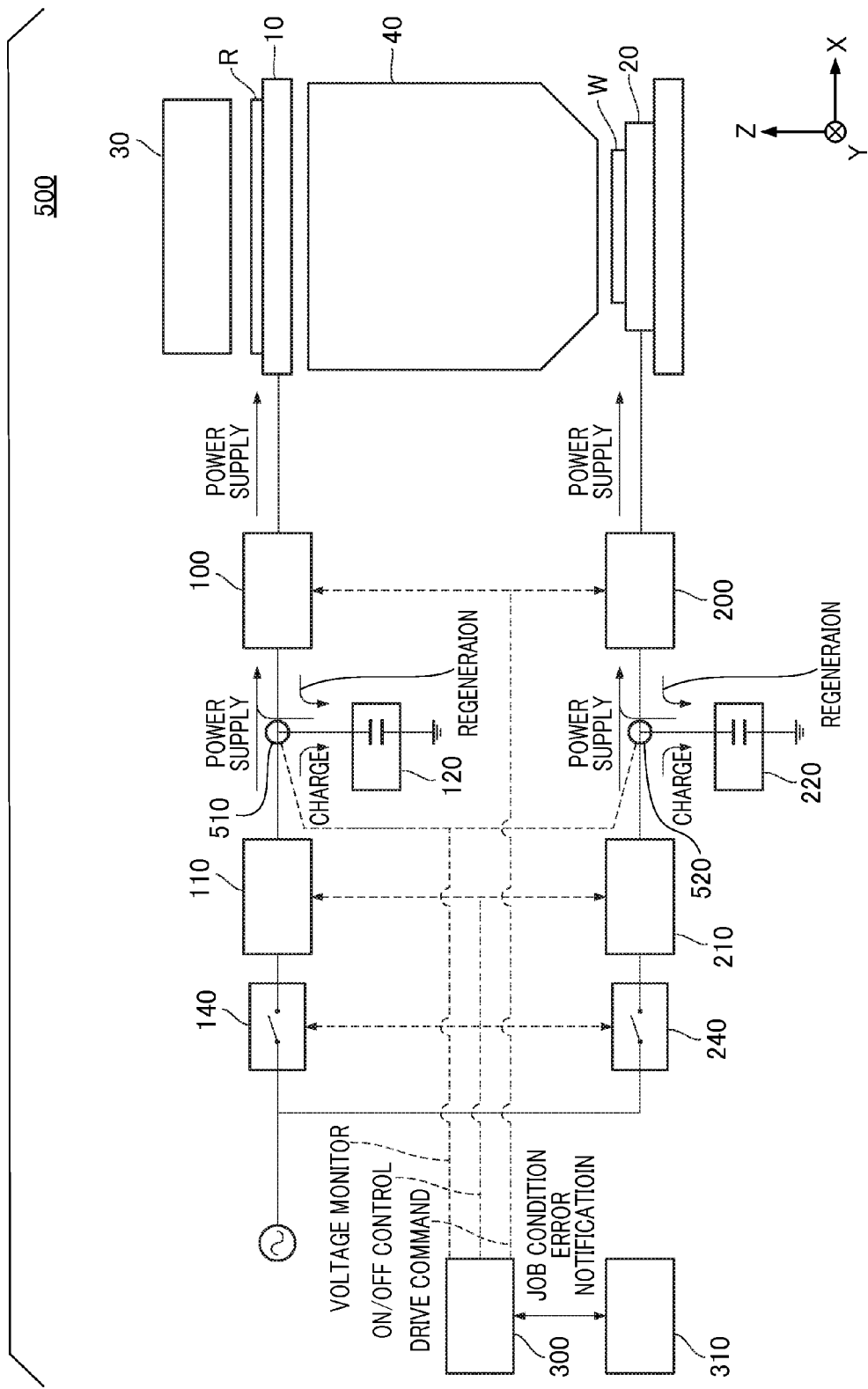
FIG. 6 illustrates a configuration of the exposure apparatus according to a second embodiment of the present invention.

Next, a description will be given of a lithography apparatus according to a second embodiment of the present invention. FIG. 6 is a schematic diagram illustrating configuration of an exposure apparatus 500 according to the present embodiment. Compared to the exposure apparatus 1 according to the first embodiment, the feature of the exposure apparatus 500 is that the controller 300 further controls turning ON/OFF of each of the power sources 110 and 210 or each of the switches 140 and 240 on the basis of capacitor voltage of each of the capacitors 120 and 220. In particular, the exposure apparatus 500 has a plurality of voltmeters corresponding to the plurality of capacitors. Specifically, a first voltmeter 510 measures capacitor voltage of the first capacitor 120, and a second voltmeter 520 measures capacitor voltage of the second capacitor 220, and the both voltmeters are respectively connected to the controller 300 via a signal wire. It is noted that same reference numerals are provided to each of the elements of the exposure apparatus 500 corresponding to each element of the exposure apparatus 1.

Figure 7:
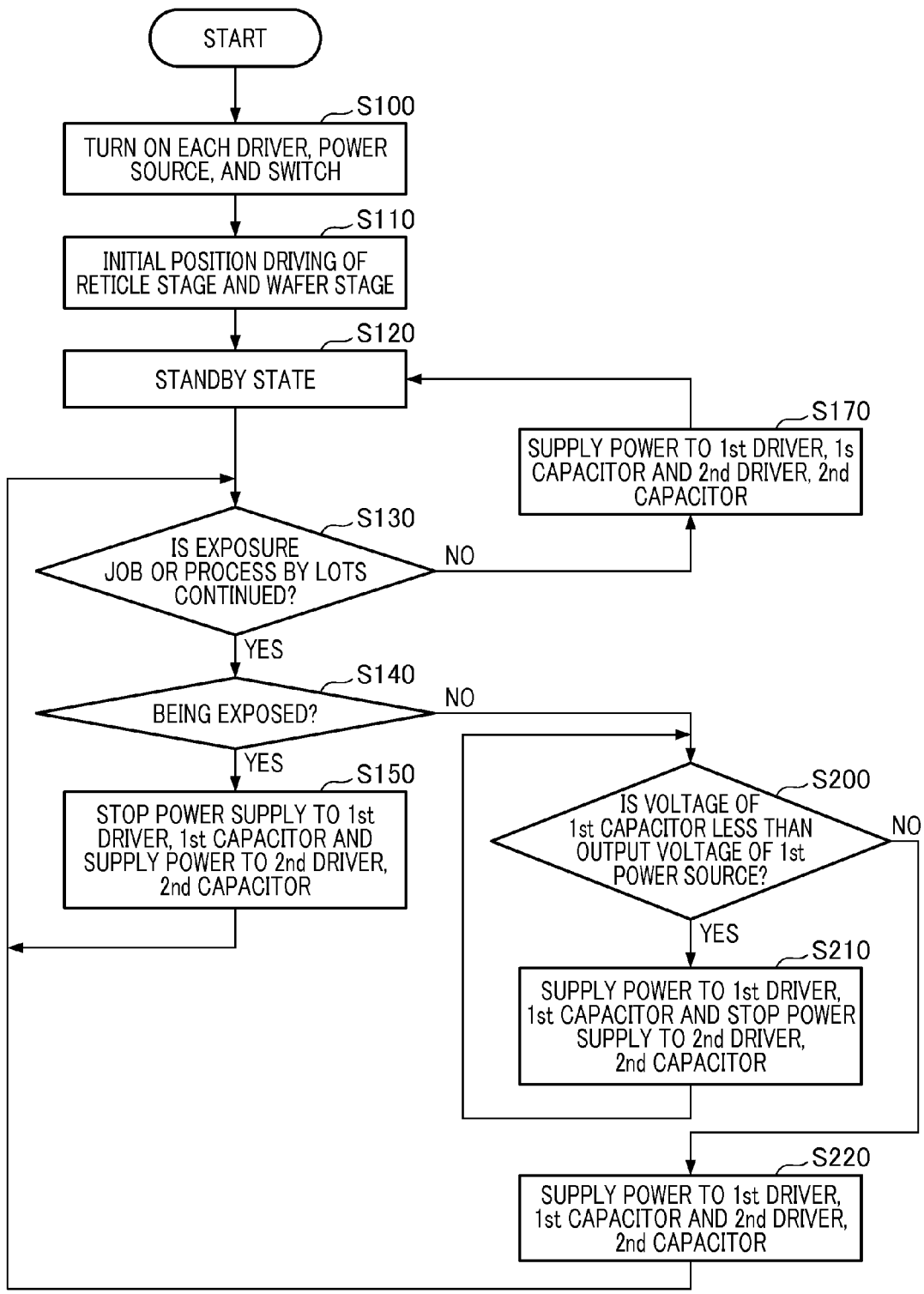
FIG. 7 is a flowchart illustrating a flow of controlling the driving system in the second embodiment.

FIG. 7 is a flowchart illustrating a flow of the operation control of the stage driving system in accordance with the flow of the whole process in the present embodiment. In FIG. 7, steps S100 to S150 and S170 are the same processes illustrated in FIG. 2 in the first embodiment. In particular, in the following process in FIG. 7, the controller 300 judges whether the capacitor voltage of the first capacitor 120 is less than output voltage of the first power source 110 or not, during a period which the capacitor 300 judges "not-being exposed" (No) in step S140 (step S200). Here, in the case where the controller 300 judges that the capacitor voltage of the first capacitor 120 is less than the output voltage (Yes), the controller 300 turns ON the first power source 110 or the first switch 140, and simultaneously turns OFF the second power source 210 or the second switch 240 in a manner similar to the step S160 in the FIG. 2. The process of the step S210 is maintained until the controller 300 judges that the capacitor voltage of the first capacitor 120 is more than the output voltage (No) in step S200. And, in the case where the controller 300 judges that the capacitor voltage of the first capacitor 120 is more than the output voltage in step S200, each of the power sources 110 and 210 and each of the switches 140 and 240 are turned ON (step S220). The processes of steps S140 and S150 or S200 through S220 are repeated during a period when the exposure job or the process by lots is continued.

Figure 8:
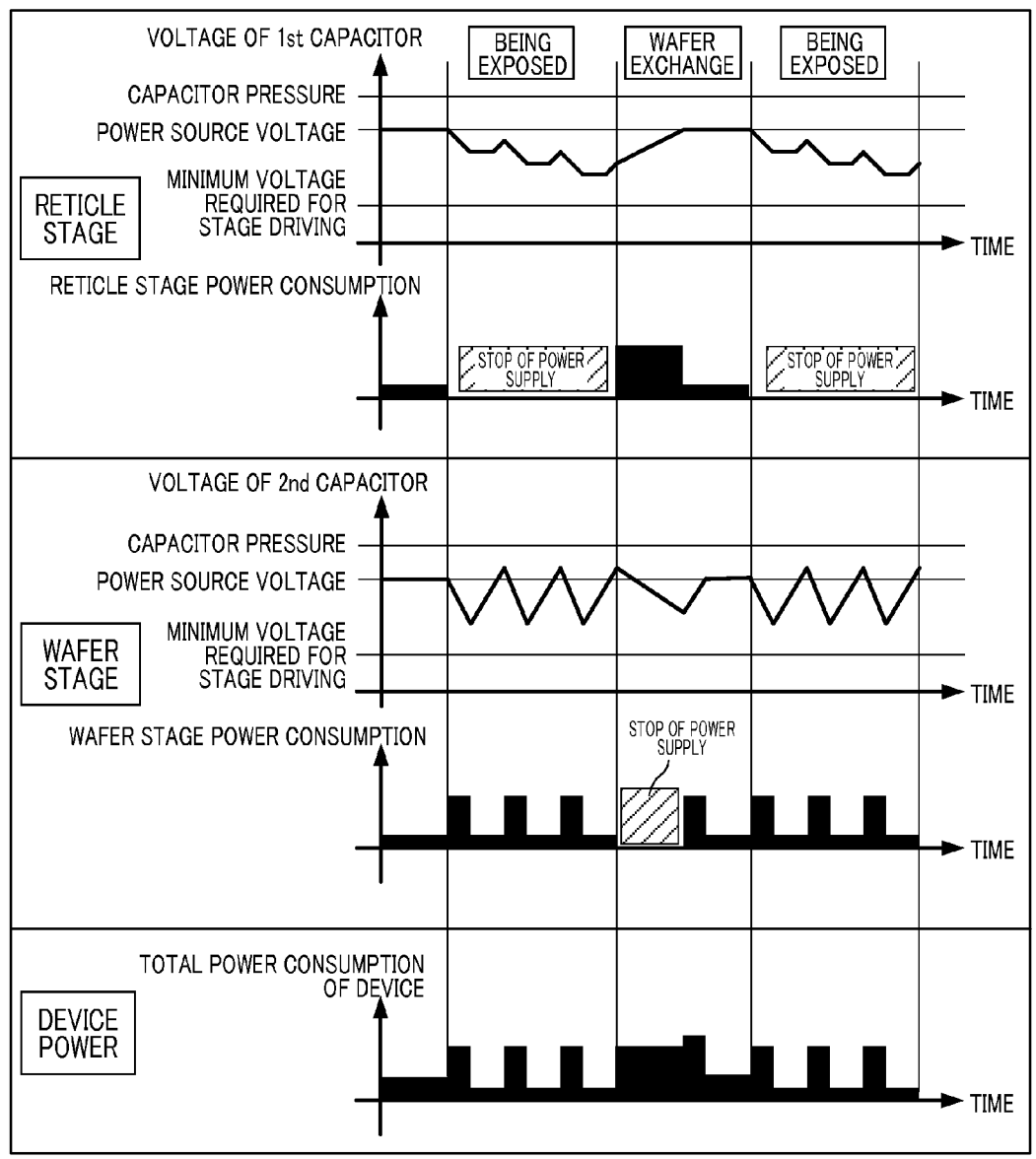
FIG. 8 is a graph illustrating a change of a capacitor voltage in the second embodiment.

FIG. 8 is a graph illustrating changes of each voltage and each power consumption of the first and second capacitors 120 and 220 in the second embodiment. The period when the step movement of each of the stages 10 and 20 and the irradiation of the exposure light are performed (the period described as "being exposed" in FIG. 8) is similar to that of FIG. 3 in the first embodiment. In particular, in the period when the step movement of the reticle stage 10 and the irradiation of the exposure light are performed in step S140 in FIG. 7, the capacitor voltage decreases in accordance with the consumption of the charge of the first capacitor 120, so that the capacitor voltage is less than the output voltage of the first power source 110. Thus, in the present embodiment, the controller 300 performs the process of step S210 in FIG. 7, during the period when the step movement and the irradiation of the exposure light are not performed (period shown as "wafer exchange" in FIG. 8) and during the period when the capacitor voltage is less than the output voltage. That is, the controller 300 turns ON the first power source 110 and the first switch 140 at the reticle stage 10 side and charges to the capacitor 120. Concerning the wafer stage 20 side, the controller 300 turns OFF the second power source 210 and the second switch 240 to stop the power supply in this time. The fact that the capacitor voltage of the first capacitor 120 is more than the output voltage of the first power source 110 while the step movement and the irradiation of the exposure light are not performed means that the charge to the first capacitor 120 is completed. Then, the second power source 210 and the second switch 240 are tuned ON in step S220 of FIG. 7 when the controller 300 judges that the capacitor voltage is more than the output voltage in step S200 of FIG. 7. Thereby, it is possible to prepare for the following step movement and the following irradiation of the exposure light by charging the power of the wafer stage 20 that was consumed during a period when the step movement and the irradiation of the exposure light are performed, during a period when the step movement and the irradiation of the exposure light are not performed.

According to the present embodiment, the peak power of the lithography apparatus can be reduced more flexibly according to various exposure jobs, with results similar to those of the first embodiment.

It is noted that, in each of the embodiments, as illustrated using FIG. 3 and FIG. 8, the stopping of the power supply to each driving unit strictly corresponds to the periods when exposure is performed and the period when exposure is not performed, as the period of "being exposed" and "wafer exchange" respectively. However, the present invention is not limited to this. For example, it may be possible to overlap the periods of the stopping of the power supply of the stages 10 and 20 if the peak of power consumption of the reticle stage 10 and that of the wafer stage 20 are not overlapped, so as not to increase peak power at the side of device power. Moreover, in the example of FIG. 3, the power supply for the reticle stage 10 is stopped for the entire period in "being exposed", but it is not necessary to stop power supply through the entire period as long as the above condition is satisfied, and the period of power supply may be partially included in the entire period.

Furthermore, the operation of the driving unit and the power supply of the reticle stage 10 and the wafer stage 20 are exemplified in the above embodiments, but the present invention is not limited to this. For example, the present invention is applicable likewise to a driving unit which drives in synchronization with another masking blade and an active counter thereof. Moreover, in the above embodiments, the driver, the power source, the switch, and the capacitor are exemplified as components to configure the stage driving system, but it may include other components as long as the operation and the power supply of the driving system as described above can be carried out. For example, in the above embodiments, two (a plurality of) power sources, i.e. the first power source 110 corresponding to the driving system for the reticle stage 10 and the second power source 210 corresponding to the driving system for the wafer stage 20, are used. However, the present invention is not limited to this, and, for example, a configuration is also possible in which one power source is provided, each switch is located halfway to each driver and each capacitor of each driving unit downstream side of the power source.

Furthermore, in each of the above embodiments, the exposure apparatus is exemplified as a lithography apparatus, but the present invention is not limited to this, and other lithography apparatuses comprising a plurality of driving units driven in synchronization may be employed. For example, a drawing apparatus for drawing on a substrate (the photosensitizer thereon) with a charged particle beam such as an electron beam may be employed, or an imprint apparatus for molding an imprint material by a mold to form a pattern on a substrate may be also employed.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity, and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-215364 filed Oct. 16, 2013, which is hereby incorporated by reference herein in its entirety.

What is claimed is:

1. A lithography apparatus that includes a plurality of driving units which include a first driving unit and a second driving unit different from the first driving unit, driving in synchronization to each other within a synchronization period and driving in asynchronization to each other within an asynchronization period, the lithography apparatus comprising:
    a plurality of capacitors which include a first capacitor capable of charging power to drive the first driving unit and a second capacitor capable of charging power to drive the second driving unit;
    a power source configured to supply power required for driving to each of the plurality of driving units and for charging power to each of the plurality of capacitors;
    a plurality of switching units respectively switching whether or not the power is supplied from the power source to each of the plurality of driving units and each of the plurality of capacitors; and
    a controller configured to control switching of the plurality of switching units,
    wherein the controller is configured to control the switching to cause the power source to stop supplying the power to the first driving unit and the first capacitor, and to cause the first driving unit to drive with the power charged in the first capacitor, in at least a part of the synchronization period and to control the switching to cause the power source to stop supplying the power to the second driving unit and the second capacitor and to cause the second driving unit to drive with the power charged in the second capacitor, in at least a part of the asynchronization period.

2. The lithography apparatus according to claim 1, wherein the plurality of capacitors are capable of charging regenerative power from the plurality of the driving units, in addition to the power from the power source.

3. The lithography apparatus according to claim 1, wherein the controller is configured to determine, based on a sequence, a driving unit of the plurality of driving units and a capacitor of the plurality of capacitors to which the power source stops supplying the power.

4. The lithography apparatus according to claim 1, further comprising a plurality of voltmeters for respectively measuring voltage of the plurality of capacitors,
    wherein the controller is configured to determine, based on values of the voltage measured at the voltmeters, a driving unit of the plurality of driving units and a capacitor of the plurality of capacitors to which the power source stops supplying the power.

5. The lithography apparatus according to claim 4, wherein, in a case where the voltage of the first capacitor measured at the voltmeter is less than an output voltage of the power source, the controller is configured to stop supplying the power to the second driving unit and the second capacitor, and to drive the second driving unit with the power charged in the second capacitor, in at least a part of the asynchronization period.

6. The lithography apparatus according to claim 1, wherein the lithography apparatus is an exposure apparatus that illuminates a pattern formed on an original with a light and exposes an image of the pattern to a substrate through a projecting optical system, and
    wherein the plurality of driving units include a driving unit for moving an original holder holding the original and a driving unit for moving a substrate holder holding the substrate.

7. A method of supplying power required for driving to each of a plurality of driving units which include a first driving unit and a second driving unit different from the first driving unit, driving in synchronization to each other within a synchronization period and driving in asynchronization to each other within an asynchronization period, the method comprising:
    a first step, in at least a part of the synchronization period, for stopping supplying power to the first driving unit and a first capacitor which is capable of charging the power from a power source and is corresponding to the first driving unit, and for driving the first driving unit with the power charged in the first capacitor; and
    a second step, in at least a part of the asynchronization period, for stopping power supply to the second driving unit and a second capacitor which is capable of charging the power from the power source and is corresponding to the second driving unit, and for driving the second driving unit with the power charged in the second capacitor.

8. A method of manufacturing an article, the method comprising steps of:
    forming a pattern on a substrate using a lithography apparatus; and
    processing the substrate on which the pattern has been formed to manufacture the article,
    wherein the lithography apparatus includes a plurality of driving units which include a first driving unit and a second driving unit different from the first driving unit, driving in synchronization to each other within a synchronization period and driving in asynchronization to each other within an asynchronization period, the lithography apparatus comprising:

a plurality of capacitors which include a first capacitor capable of charging power to drive the first driving unit and a second capacitor capable of charging power to drive the second driving unit;

a power source configured to supply power required for driving to each of the plurality of the driving units and for charging power to each of the plurality of the capacitors;

a plurality of switching units respectively switching whether or not power is supplied from the power source to each of the plurality of driving units and each of the plurality of capacitors; and a controller configured to control switching of the switching units, wherein the controller is configured to control the switching to cause the power source to stop supplying the power to the first driving unit and the first capacitor, and to cause the first driving unit to drive with the power charged in the first capacitor, in at least a part of the synchronization period and to control the switching to cause the power source to stop supplying the power to the second driving unit and the second capacitor and to cause the second driving unit to drive with the power charged in the second capacitor, in at least a part of the asynchronization period.

* * * * *